(12) United States Patent
Irby et al.

(10) Patent No.: US 8,094,476 B2
(45) Date of Patent: Jan. 10, 2012

(54) CONTENT ADDRESSABLE MEMORY MATCH SIGNAL TEST DEVICE AND METHODS THEREOF

(75) Inventors: Joel Thornton Irby, Austin, TX (US); Karthik Natarajan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 530 days.

(21) Appl. No.: 12/260,553

(22) Filed: Oct. 29, 2008

(65) Prior Publication Data

US 2010/0103712 A1 Apr. 29, 2010

(51) Int. Cl.
*G11C 15/00* (2006.01)
(52) U.S. Cl. .............. 365/49.17; 365/49.1; 365/201
(58) Field of Classification Search ............. 365/49.1 X, 365/49.17 O, 201 X, 49.1, 49.17, 201
See application file for complete search history.

(56) References Cited

U.S. PATENT DOCUMENTS

| | | | |
|---|---|---|---|
| 6,587,996 B1 | 7/2003 | Reohr, Jr. et al. | |
| 6,618,279 B2 * | 9/2003 | Towler et al. | 365/49.18 |
| 7,193,877 B1 * | 3/2007 | Yelluru | 365/49.1 |
| 7,254,753 B2 * | 8/2007 | Loughmiller | 714/703 |
| 7,355,881 B1 | 4/2008 | Dankert et al. | |

* cited by examiner

*Primary Examiner* — VanThu Nguyen

(57) ABSTRACT

A content addressable memory (CAM) of a data processing device can operate in a normal mode or a test mode. In the normal mode, the CAM provides a match value in response to determining that a received data value matches one of a plurality of values stored at memory locations of the CAM. In a test mode of operation, a plurality of test signals are applied to the CAM, and the CAM provides a match value in response to assertion of one of the test signals. The match value is applied to a functional module associated with the CAM to determine a test result. Accordingly, the test signals applied to the CAM provide a flexible way to generate match values and apply those values to the functional module during testing of the data processing device.

20 Claims, 3 Drawing Sheets

# CONTENT ADDRESSABLE MEMORY MATCH SIGNAL TEST DEVICE AND METHODS THEREOF

FIELD OF THE DISCLOSURE

The present disclosure relates to data processing devices and more particularly relates to testing of data processing devices.

BACKGROUND

After manufacture, a data processing device is typically tested to ensure the device behavior matches a specification. For a typical test, a test pattern is applied to an input of the data processing device and a resultant output pattern compared to an expected output pattern. The test pattern typically tests only a portion of the possible states of the data processing device. Accordingly, the data processing device is tested with a variety of different test patterns in order to increase the number of possible states tested. However, because of the complexity of modern data processing devices, it can be difficult to test all portions of a device with a set of test patterns. For example, it can be problematic to test memory and associated devices using a set of general test patterns.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In accordance with a specific embodiment of the present disclosure, a content addressable memory (CAM) of a data processing device can operate in a normal mode or a test mode. In the normal mode, the CAM provides a match value in response to determining that a received data value matches one of a plurality of values stored at memory locations of the CAM. In a test mode of operation, a plurality of test signals are applied to the CAM, and the CAM provides a match value in response to assertion of one of the test signals. The match value is applied to a functional module associated with the CAM to determine a test result. Accordingly, the test signals applied to the CAM provide a flexible way to generate match values and apply those values to the functional module during testing of the data processing device.

Figure 1:
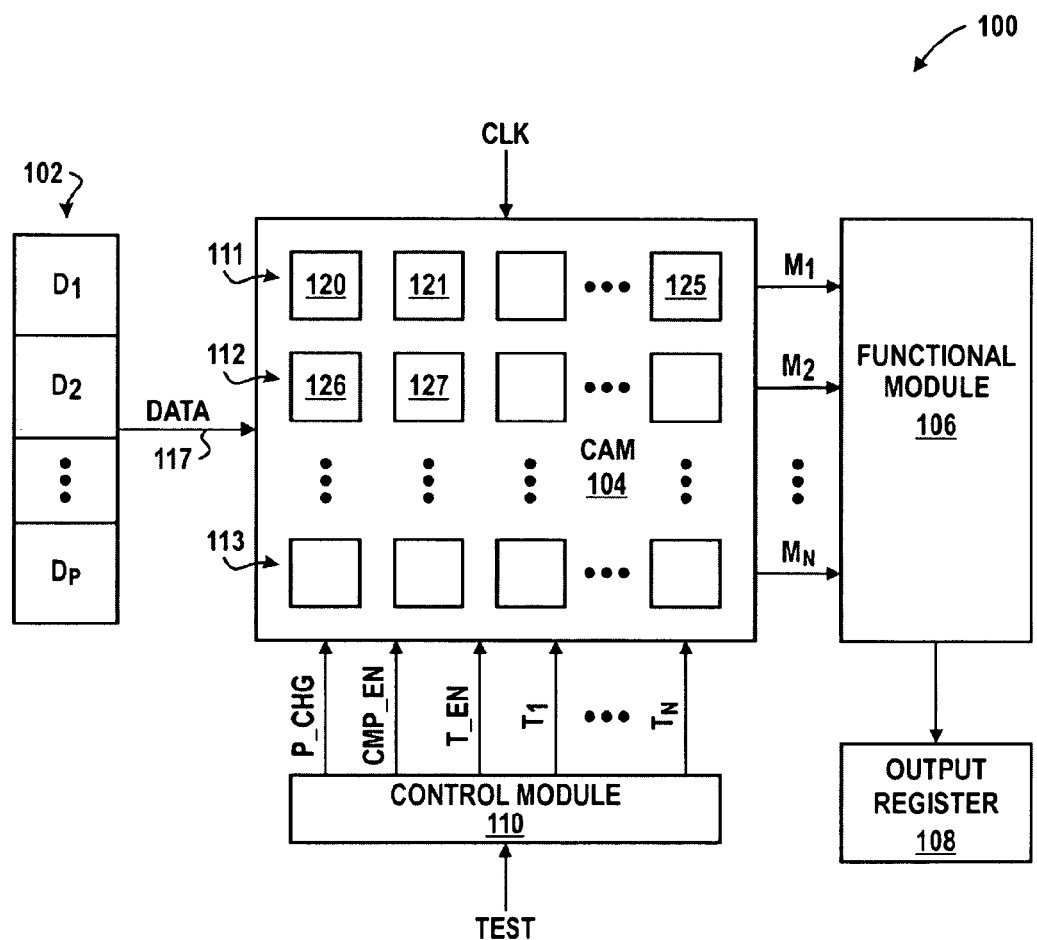
FIG. 1 is a block diagram of a data processing device in accordance with one embodiment of the present disclosure.

Referring to FIG. 1, a block diagram of a particular embodiment of a data processing device 100 is illustrated. The data processing device 100 includes a register 102, a CAM 104, a functional module 106, an output register 108, and a control module 110. The register 102 is connected to a bus 117 to provide a signal labeled "DATA." The CAM 104 includes an input connected to the bus 117, an input to receive a signal labeled "P_CHG", an input to receive a signal labeled "CMP_EN", an input to receive a signal labeled T_EN, and inputs to receive a set of signals labeled "$T_1$" through "$T_N$." The CAM 104 also includes an input to receive a clock signal labeled "CLK" and outputs to provide a set of signals labeled "$M_1$" through "$M_N$." The control module 110 includes an input to receive a signal labeled "TEST" and outputs to provide the signals P_CHG, CMP_EN, T_EN, and $T_1$ through $T_N$. The functional module 106 includes inputs to receive the signals $M_1$ through $M_N$ and an output. The output register 108 includes an input connected to the output of the functional module 106.

The CAM 104 includes a number of memory cells, such as memory cells 120, 121, and 125, where match data is stored. The memory cells are organized into rows, such as rows 111, 112, and 113. In the illustrated embodiment of FIG. 1, it is assumed that each memory cell stores a single bit of data, and each row of the CAM 104 stores a data value that is composed of the bits of data stored in the memory cells associated with that row. Thus, for example, memory cells 120, 121, and 125 store individual bits of the data value associated with row 111 of CAM 104. Further, it is assumed that each row of CAM 104 represents a unique memory location, and that CAM 104 includes N rows. Thus, CAM 104 can store N data values, with each data value stored at a corresponding row of CAM 104. Further, it is assumed that each row of CAM 104 is P bits wide, so that each data value is a P-bit data value. Each of the signals $M_1$ through $M_N$ is associated with one of the rows of CAM 104. For example, signal $M_1$ is associated with row 111.

Register 102 is configured to store a data value received from another module (not shown) of data processing device 100. The data value stored at register 102 is P bits wide, and includes bits labeled $D_1$, $D_2$, through $D_P$.

The control module 110 is configured to control the CAM 104 in both normal and test modes of operation, where the mode of operation is indicated by the TEST signal. When the TEST signal indicates a normal mode of operation (indicating that the data processing device 100 is in a normal mode of operation to execute specified tasks), the control module 110 initiates a content addressable access of the CAM 104 by asserting the CMP_EN signal and maintaining the T_EN signal in a negated state. In addition, the CAM 104 indicates the initiation of the content addressable access by asserting the P_CHG signal. In response, the CAM 104 precharges each of the signals $M_1$ through $M_N$ to a precharge state. In the embodiment of FIG. 1, it is assumed that the precharge state corresponds to a state that indicates a match, referred to herein as a match state. The CAM 104 then compares the data value stored at the register 102 with the data values stored at rows 111 through 113. In particular, CAM 104 compares each bit of the data value stored at the register 102 with the bit stored at the corresponding memory cell of each row. Thus, for example, bit $D_1$ is compared to the bits stored at memory cells 120 and 126, while bit $D_2$ is compared to the bits stored at memory cells 121 and 127. In the event that any bit in a row of CAM 104 does not match the corresponding bit of the data value stored at register 102, CAM 104 sets the output signal corresponding to the row to a state indicating no match, referred to herein as a no-match state. Thus, for example, if the data value stored at register 102 does not match the value stored at row 112, CAM 104 sets the signal $M_2$ to the no-match state. The signals $M_1$ through $M_N$ will thereby represent a match value indicative of whether CAM 104 stores the data value at register 102, and also indicative of which particular row or rows store the data value.

In response to the TEST signal indicating a test mode of operation, the control module 110 asserts the T_EN signal and maintains the CMP_EN signal in a negated state. The control module 110 initiates a test by asserting the P_CHG signal, causing CAM 104 to place signals $M_1$ through $M_N$ at the precharge state. The control module 110 then applies a test pattern to the CAM 104 via signals $T_1$ through $T_N$. In particular, each of the signals $T_1$ through $T_N$ is associated with a row of CAM 104. In response to assertion of one or more of signals $T_1$ through $T_N$, CAM 104 indicates a non-match via the signals $M_1$ through $M_N$ corresponding to the rows associated with the asserted signals. For example, it is assumed that signal $T_1$ is associated with row 111. Accordingly, in response to assertion of the signal $T_1$, CAM 104 sets the signal $M_1$ to a non-match state. Thus, control module 110 can set signals $M_1$ through $M_N$ to indicate a designated match value by setting the signals $T_1$ through $T_N$ to the designated match value. Control module 110 thereby provides a flexible way to set match values without having to store particular values at CAM 104.

Functional module 106 is configured to perform one or more designated functions in both the test and normal modes. As used herein, a functional module refers to one or more logic gates, storage elements, and other devices, or any combination thereof, configured to perform the function associated with the functional module. In response to receiving a match value, as indicated by the signals $M_1$ through $M_N$, the devices of the functional module generate an output value and store the output value at output register 108. In the normal mode of operation, the output value provides information based on the match value to allow the data processing device 100 to perform one or more designated functions. For example, in the normal mode of operation, the output value can represent a memory address for retrieval of data, an error or control code, and the like.

In the test mode of operation, the value generated by the functional module 106 and stored at output register 108 represents a test value generated based on the test pattern indicated by signals $T_1$ through $T_N$. The test value can be compared to an expected value to determine a test result, indicating whether the functional module 106 is operating according to a specification. In an embodiment, the output register 108 is a scan register, allowing the test value to be provided to an external tester via an input/output pin (not shown) of the data processing device 100. In another embodiment, the test value at the output register 108 can be read by software executing at the data processing device 100.

In addition, control module 110 can apply multiple test patterns to CAM 104, thereby causing generation of multiple test values by functional module 106. The multiple test values can be compared to a set of expected values to determine if the behavior of the functional module 106 matches a specification.

Figure 2:
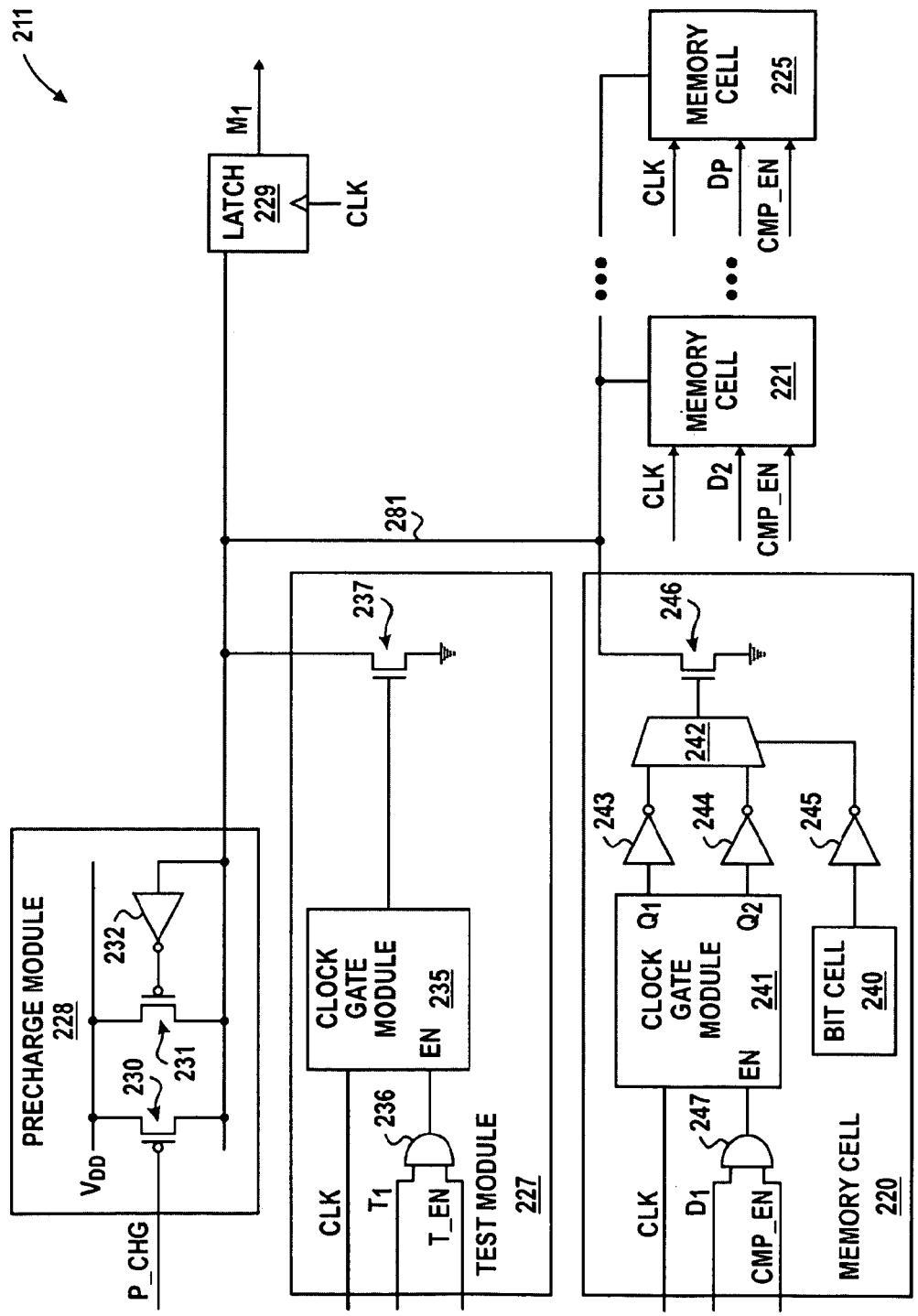
FIG. 2 is a combined block and circuit diagram of a portion of the content addressable memory of FIG. 1 in accordance with one embodiment of the present disclosure.

FIG. 2 illustrates a combined block and circuit diagram of a particular embodiment of a portion of CAM 104. In particular, FIG. 2 illustrates a portion of CAM 104 associated with a row 211, corresponding to row 111 of FIG. 1. It will be appreciated that other rows of CAM 104 can be configured similarly.

Row 211 includes memory cells 220, 221, through memory cell 225. Row 211 also includes test module 227, a precharge module 228, and a latch 229. Precharge module 228 includes p-channel transistors 230 and 231 and an inverter 232. Transistor 230 includes a first current electrode connected to a voltage reference labeled $V_{DD}$, a second current electrode connected to a bit line 281 and a control electrode to receive the signal P_CHG. The inverter 232 includes an input connected to the bit line 281 and an output. The transistor 231 includes a current electrode connected to the voltage reference $V_{DD}$, a current electrode connected to the bit line 281, and a control electrode connected to the output of the inverter 232.

The test module 227 includes an AND gate 236, a clock gate module 235, and an n-channel transistor 237. The AND gate 236 includes an input to receive the signal $T_1$, an input to receive the signal $T_{EN}$ and an output. The clock gate module 235 includes an input to receive the CLK signal, an input labeled "EN" connected to the output of the AND gate 236, and an output. The transistor 237 includes a current electrode connected to the bit line 281, a current electrode connected to a ground voltage reference, and a control electrode connected to the output of the clock gate module 235.

Memory cell 220 includes an AND gate 247, a clock gate module 241, a bit cell 240, inverters 243, 244, and 245, a multiplexer 242 and an n-channel transistor 246. The AND gate 247 includes an input to receive the signal $D_1$, an input to receive the signal CMP_EN, and an output. The clock gate module 241 includes an input to receive the signal CLK, an input connected to the output of the AND gate 247, a first output labeled "$Q_1$" and a second output labeled "$Q_2$". The inverter 243 includes an input connected to the $Q_1$ output of the clock gate module 241 and an output. The inverter 244 includes an input connected to the $Q_2$ output of the clock gate module 241 and an output. The bit cell 240 includes an output. The inverter 245 includes an input connected to the output bit cell 240 and an output. The multiplexer 245 includes an input connected to the output of the inverter 243, an input connected to the output of the inverter 244, a control input connected to the output of the inverter 245, and an output. The transistor 246 includes a current electrode connected to the bit line 281, a current electrode connected to the ground voltage reference, and a control electrode connected to the output of the multiplexer 242. The latch 229 includes an input connected to the bit line 281, a clock input configured to receive the CLK signal, and an output to provide the signal $M_1$.

During operation, in response to assertion of the P_CHG signal, transistor 230 becomes conductive, thereby pulling the bit line 281 to a precharge state corresponding to a voltage near the voltage reference $V_{DD}$. The inverter 232 and transistor 231 are configured as a keeper circuit that maintains the bit line 281 at the pre-charge state in the absence of other stimuli. However, inverter 232 and transistor 231 are configured such that bit line 281 can be pulled to a voltage substantially close to the ground reference voltage by transistor 237 or 246, or by any of memory cells 221 through 225.

Clock gate module 241 and AND gate 247 are configured so that, when the signal CMP_EN is asserted, the clock gate module 241 will generate a clock pulse in response to a clock pulse of the CLK signal. In particular, the clock gate module 241 will generate the clock pulse at the $Q_1$ output in response to $D_1$ being in an asserted state and will generate the clock pulse at the $Q_2$ output in response to $D_1$ being in a negated state. The multiplexer 242 selects an output of the clock gate module (as passed through inverters 243 and 244) based on the data stored at the bit cell 240. In particular, the multiplexer 242 is configured so that, when the signal $D_1$ does not match the data stored at the bit cell 240, a pulse is generated at the output of the multiplexer 242. The transistor 246 is thereby rendered conductive, pulling the voltage at the bit line 281 to substantially near the ground voltage reference. The state of the bit line 281 is stored at the latch 229 in response to an edge of the CLK signal. Thus, in response to $D_1$ not matching the data stored at the bit cell 240, the signal $M_1$ is latched to the non-match state.

It will be appreciated that each of the memory cells 221 through 225 are configured similarly to memory cell 240, and compare data stored at their associated bit cells with the data bits $D_2$ through $D_N$, respectively. Accordingly, if any of the data bits $D_1$ through $D_N$ do not match the data stored at the corresponding memory cell, the signal $M_1$ is latched to the non-match state.

In the test mode of operation, as indicated by assertion of the signal T_EN, the AND gate 236 and the clock gate module 235 are configured to generate a pulse at the output of the clock gate module in response to assertion of the signal $T_1$ and in response to a pulse of the clock signal CLK. The transistor 237 is thereby rendered conductive, pulling the voltage at the bit line 281 to substantially near the ground voltage reference. The state of the bit line 281 is stored at the latch 229 in response to an edge of the CLK signal. Thus, in response to $D_1$ not matching the data stored at the bit cell 240, the signal $M_1$ is latched to the non-match state. If the signal $T_1$ is not asserted, the clock gate module 235 does not generate a pulse, so that the signal $M_1$ remains in the pre-charged match state. Accordingly, in the test mode of operation, the state of the signal $M_1$ is determined by the signal $T_1$.

Figure 3:
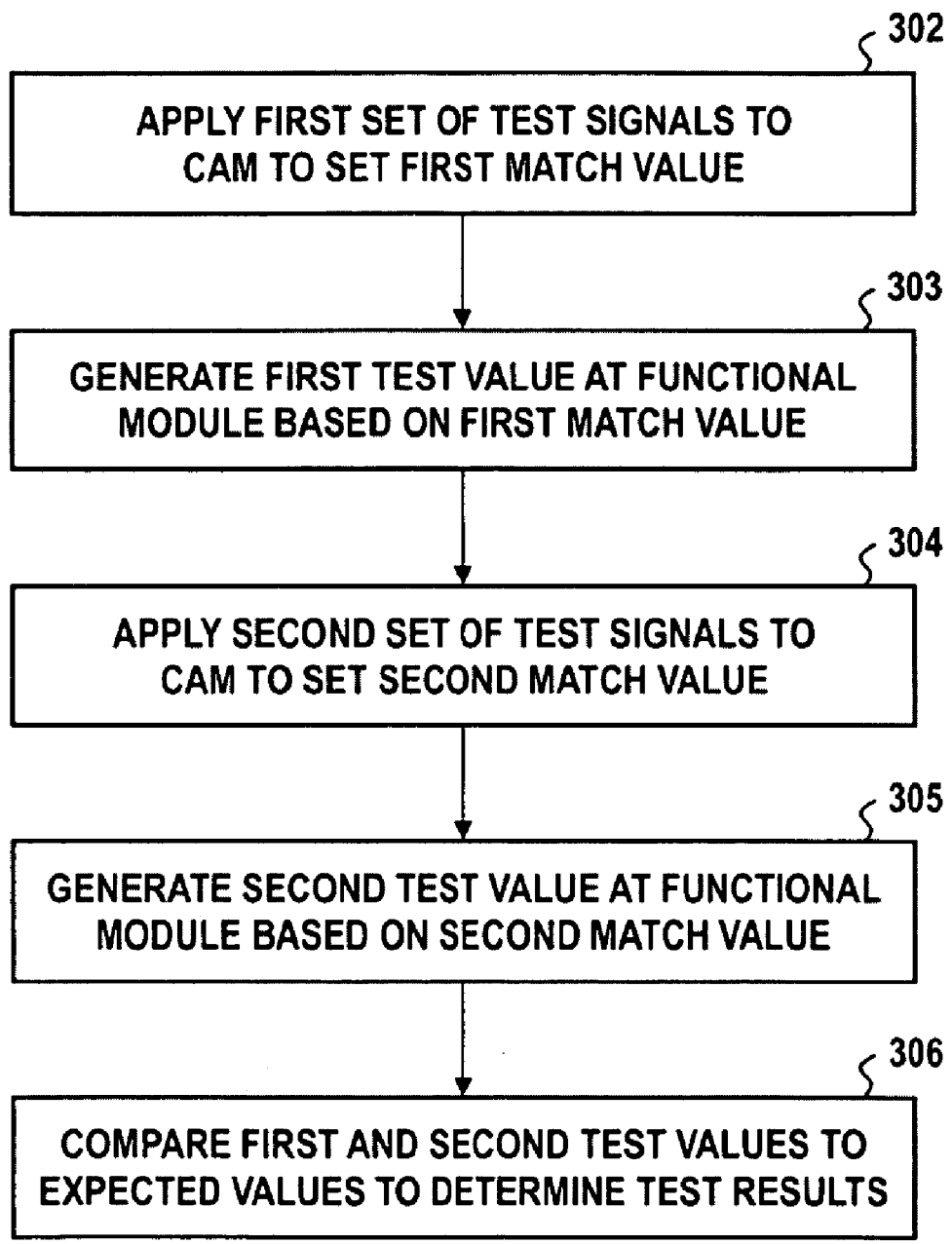
FIG. 3 is a flow diagram of a method of testing the data processing device of FIG. 1 in accordance with one embodiment of the present disclosure.

Referring to FIG. 3, a flow diagram of a particular embodiment of a method of testing the data processing device 100 is illustrated. At block 302, the control module 110 applies a first set of test signals to the CAM 104. In response to the first set of test signals, the CAM 104 provides a first match value at the output, via signals $M_1$ through $M_N$. At block 303, the functional module 106 generates a first test value based on the first match value, and stores the first test value at the output register 108. In an embodiment, the first test value is communicated to an external tester.

At block 304, the control module 110 applies a second set of test signals to the CAM 104. In response to the second set of test signals, the CAM 104 provides a second match value at the output. At block 305, the functional module 106 generates a second test value based on the second match value, and stores the second test value at the output register 108. In an embodiment, the second test value is communicated to the external tester. At block 306, the first and second test values are compared to expected values to determine test results. The test results indicate whether the functional module 106 is configured according to a specification. Accordingly, qualification of the data processing device 100 can be determined based on the test results.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A method, comprising:
    in a first mode of operation, providing at a first output a first match value associated with a first memory location of a content addressable memory (CAM) in response to determining a value stored at the first memory location matches a value received at a first input of the CAM; and
    in a second mode of operation, providing at the first output the first match value in response to assertion of a first test signal of a plurality of test signals, the first test signal received at a second input of the CAM, the first match value not based on the value stored at the first memory location in the second mode of operation.

2. The method of claim 1, wherein:
    providing the first match value in the first mode of operation comprises:
        precharging a first bitline to a first state; and
        when the first bitline is in the first state, setting the first bitline to a second state in response to determining the value stored at the first memory location matches a reference value; and
    providing the first match value in the second mode of operation comprises:
        precharging the first bitline to the first state; and
        when the first bitline is in the first state, setting the first bitline to the second state in response to assertion of the first test signal.

3. The method of claim 1, further comprising:
    in the second mode of operation, determining a test result value based on the first match value; and
    comparing the test result value to an expected value to determine a test result.

4. The method of claim 3, wherein determining the test result value comprises:
    applying the first match value to an input of a functional module of an integrated circuit device and
    determining the test result value at an output of the functional module in response to applying the test result value.

5. The method of claim 4, wherein applying the first match value comprises transitioning a first value applied at the input of the functional module to the test result value and determining the test result value comprises determining the test result value in response to transitioning the first value.

6. The method of claim 1, further comprising:
    in the first mode of operation, providing at a second output a second match value associated with a second memory location of CAM in response to determining a value stored at the second memory location matches the reference value; and
    in the second mode of operation, providing at the second output the second match value in response to assertion of a second test signal.

7. The method of claim 1, further comprising:
    in the second mode of operation:
        providing the first match value at the first output at a first time in response to a first assertion of the first test signal;
        providing a first transition from the first match value to a second match value at a second time in response to negation of the first test signal, the second time after the first.

8. The method of claim 7, further comprising:
    determining a test result value in response to the first transition; and
    comparing the test result value to an expected result to determine a test result.

9. The method of claim 7, further comprising:
    in the second mode of operation, providing a second transition from the second match value to the first match value at a third time in response to a second assertion of the first test signal.

10. The method of claim 7, further comprising:
    determining a test result value in response to the second transition; and
    comparing the test result value to an expected result to determine a test result.

11. The method of claim 7, further comprising
    determining a test result value in response to the first transition and the second transition; and comparing the test result value to an expected result to determine a test result.

12. A method, comprising:
in a normal mode of operation:
comparing a first value to a plurality of values, each of the plurality of values stored at a corresponding memory location of a content addressable memory (CAM);
asserting a first indicator at a first output of the CAM in response to determining the first value matches one of the plurality of values; and
in a test mode of operation:
applying a plurality of test signals to the CAM, each of the plurality of test signals associated with a corresponding memory location of the CAM; and
asserting the first indicator at the first output of the CAM in response to assertion of a first of the plurality of test signals; the first indicator not based on the plurality of values in the test mode of operation.

13. The method of claim 12, wherein the first output of the CAM is associated with a first memory location of the CAM, and wherein the one of the plurality of test signals is associated with the first memory location.

14. The method of claim 12, further comprising:
in the test mode of operation, asserting a second indicator at a second output of the CAM in response to assertion of a second of the plurality of test signals.

15. The method of claim 12, further comprising:
in the test mode of operation, determining a test value in response to asserting the first indicator;
comparing the test value to an expected value to determine a test result.

16. A device, comprising:
a first memory cell, comprising:
an input configured to receive a first data value;
a bit cell configured to store a second data value; and
an output coupled to a first bit line, the output configured to assert a first signal in response to the first data value matching the second data value; and
a first test module, comprising:
a first input configured to receive a first test signal; and
an output coupled to the first bit line, the output configured to assert a second signal in response to assertion of the first test signal, the second signal not based on the second data value.

17. The device of claim 16, wherein the first test module further comprises a second input to receive a test mode indication signal, and wherein the output of the test module is configured to assert the second signal in response to assertion of the first test signal and the test mode indication signal.

18. The device of claim 16, further comprising:
a second memory cell, comprising:
an input configured to receive a third data value;
a bit cell configured to store a fourth data value; and
an output coupled to the first bit line, the output configured to assert a third signal in response to the third data value matching the fourth data value.

19. The device of claim 16, further comprising a latch coupled to the first bit line.

20. The device of claim 19, further comprising a functional module coupled to an output of the latch.

* * * * *